United States Patent
Kajigaya

(10) Patent No.: US 8,295,101 B2
(45) Date of Patent: Oct. 23, 2012

(54) SEMICONDUCTOR DEVICE

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 76 days.

(21) Appl. No.: 13/031,073

(22) Filed: Feb. 18, 2011

(65) Prior Publication Data

US 2011/0205812 A1 Aug. 25, 2011

(30) Foreign Application Priority Data

Feb. 22, 2010 (JP) ................................. 2010-036139

(51) Int. Cl.
*G11C 7/10* (2006.01)

(52) U.S. Cl. ..................... 365/189.05; 365/205; 365/195

(58) Field of Classification Search ............. 365/189.05, 365/205, 195, 194, 22, 104, 201, 189.07, 365/200, 233, 207, 191, 230.03, 189.03
See application file for complete search history.

(56) References Cited

U.S. PATENT DOCUMENTS

| | | | |
|---|---|---|---|
| 5,953,282 A | 9/1999 | Jung et al. | |
| 6,061,295 A | 5/2000 | Roh | |
| 6,101,147 A | 8/2000 | Takahashi et al. | |
| 2011/0310688 A1* | 12/2011 | Morgan | 365/207 |
| 2012/0008440 A1* | 1/2012 | Kinsley | 365/195 |

FOREIGN PATENT DOCUMENTS

| | | |
|---|---|---|
| JP | H02-046589 A | 2/1990 |
| JP | H03-165398 A | 7/1991 |
| JP | H03-203096 A | 9/1991 |
| JP | H04-315894 A | 11/1992 |
| JP | 11-162170 A | 6/1999 |
| JP | H11-213661 A | 8/1999 |
| WO | 97/23877 A1 | 7/1997 |

* cited by examiner

*Primary Examiner* — Dang Nguyen
(74) *Attorney, Agent, or Firm* — Sughrue Mion, PLLC

(57) ABSTRACT

A semiconductor device includes a sense amplifier, transistors selectively establishing electrical connection between the sense amplifier and a data bus, depending on address; a write amplifier connected to the data bus, an external terminal outputting data from a memory cell to outside via the sense amplifier, the transistors, and the data bus in a first operation mode and supplying data from outside to the sense amplifier via the write amplifier, the data bus, and the transistors in a second operation mode, and a control circuit supplying an electric potential to gate electrodes of first transistors that establish the electrical connection depending on the address, wherein in a first operation mode, the control circuit supplies a first electric potential to the gate electrodes of the first transistors, so that the first transistors exhibit a first impedance value and in the second operation mode, the control circuit supplies a second electric potential to gate electrodes of the first transistors, so that the first transistors exhibit a second impedance value, an absolute value thereof being lower than that of the first impedance value.

24 Claims, 10 Drawing Sheets

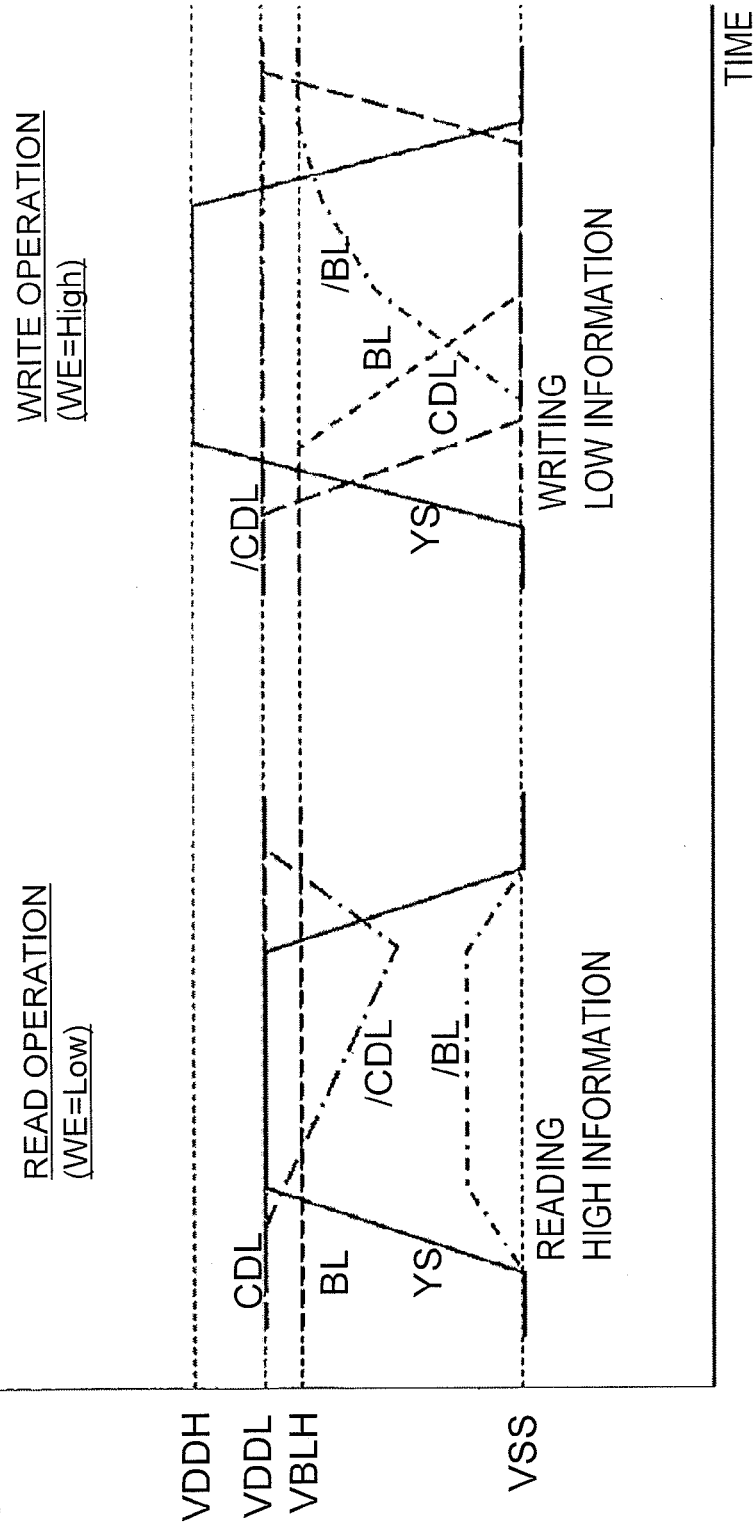

SEMICONDUCTOR DEVICE

REFERENCE TO RELATED APPLICATION

This application is based upon and claims the benefit of the priority of Japanese patent application No. 2010-036139, filed on Feb. 22, 2010, the disclosure of which is incorporated herein in its entirety by reference thereto. The present invention relates to a semiconductor device and, more particularly, it relates to a semiconductor device having a memory function.

TECHNICAL FIELD

Background

Volatile semiconductor memories, such as dynamic random access memories (DRAMs) requiring a refresh operation to retain data and static random access memories (SRAMs), and non-volatile semiconductor memories use sense amplifiers. Generally, a dynamic type latch circuit using a CMOS cross-coupled latch is employed in these sense amplifiers. When data is selectively read from a sense amplifier selected by a column address to a data bus (termed common data line) or when data from the common data line is selectively written, a selected column switch, responsive to a column selection signal supplied thereto, is set to be electrically conductive. This column switch includes nMOS transistors each having a gate supplied with a column selection signal (YS) outputted from a column decoder. The following description outlines a sense amplifier and a column switch of related arts.

<Sense Amplifier 1>

FIG. 4 is a diagram illustrating a circuit configuration of a typical example of a sense amplifier. As illustrated in FIG. 4, which is also referred to in the description of examples of the present invention, a sense amplifier (SA) using a CMOS cross-coupled latch includes nMOS transistors 43 and 44 having sources commonly coupled to a first common source line NCS; and pMOS transistors 45 and 46 having sources commonly coupled to a second common source line PCS and having drains connected to drains of the nMOS transistors 43 and 44, respectively. Gates of the nMOS transistor 44 and the pMOS transistor 46 are connected to a bit line BL, which is one of a bit line pair BL and /BL. It is noted that BL and /BL indicate "True" and "Bar" bit lines which may be designated as BLT and BLB, respectively. The bit line BL is also connected to a connection node of drains of the nMOS transistor 43 and the pMOS transistor 45. Gates of the nMOS transistor 43 and the pMOS transistor 45 are connected to the bit line /BL, which is the other one of the bit line pair BL and /BL. The bit line /BL is also connected to a connection node of drains of the nMOS transistor 44 and the pMOS transistor 46. In reading data from a memory cell, when the bit line pair BL and /BL are brought to High and Low levels, respectively, the nMOS transistor 44 and the pMOS transistor 45 are turned electrically conductive (ON) and the pMOS transistor 46 and the nMOS transistor 43 are turned electrically non-conductive (OFF). As a result, the bit line pair BL and /BL are brought to potentials of the second common source line PCS and the first common source line NCS, respectively (namely, a potential difference between the bit line pair BL and /BL is amplified and latched). When the bit line pair BL and /BL are brought to Low and High levels, respectively, the pMOS transistor 46 and the nMOS transistor 43 are turned electrically conductive and the nMOS transistor 44 and the pMOS transistor 45 are turned electrically non-conductive. As a result, the bit lines pair /BL and BL are brought to potentials of the second common source line PCS and the first common source line NCS, respectively (namely, a potential difference between the bit line pair BL and /BL is amplified and latched).

<Sense Amplifier 2>

Other than the above sense amplifier 1, another example of the sense amplifier includes a latch circuit (not illustrated) that senses memory cell information by using a sensing circuit (not illustrated) and that holds the sensed data in a volatile manner. In this case, whether this latch circuit has the above sensing capabilities is not an issue. This type of latch circuit will also be referred to as a sense amplifier herein as needed.

<Column Switch>

As illustrated in FIG. 4, a column switch (CSW) includes an nMOS transistor 41 having a source connected to the bit line BL, a gate connected to a column selection signal YS, and a drain connected to a common data line CDL, and an nMOS transistor 42 having a source connected to the bit line /BL, a gate connected to the column selection signal YS, and a drain connected to a common data line /CDL. The column switch (CSW) is arranged for each sense amplifier SA. The column switch (CSW) including an nMOS transistor may be also termed as nMOS column switch. As will be described below, a common data line pair (data bus) CDL and /CDL is arranged in common for a plurality of bit line pairs, and the sense amplifier (SA) is connected to the common data line pair CDL and /CDL via a column switch (CSW) which is turned electrically conductive by the column selection signal YS from a column decoder (not shown in FIG. 4).

Patent Document 1:

Japanese Patent Kokai Publication No. JP-H11-162170A, which corresponds to U.S. Pat. No. 6,061,295A The following analysis is given by the present invention. With continued shrinking of MOS transistor dimensions, random variations in a threshold voltage (Vt) of MOS transistors forming a CMOS cross-coupled latch in a sense amplifier and an nMOS transistor forming a column switch are increased. Thus, when the nMOS transistor forming a column switch is turned electrically conductive (ON), a noise margin with respect to capability of the sense amplifier to retain sensed data in a volatile manner is decreased.

Referring to FIG. 4, assuming that both of the common data line pair CDL and /CDL are pre-charged and equalized to a High potential and the bit line pair BL and /BL, to which memory cell data has been read, are set to High and Low levels, respectively, if the nMOS transistors 41 and 42 each forming the column switch CSW are turned electrically conductive, the bit line BL and the common data line CDL are electrically connected, and the bit line /BL and the common data line /CDL are electrically connected. Electric-charge redistribution occurs between the pre-charged common data line /CDL (High level) and the bit line /BL (Low level). Since capacitance (parasitic capacitance) of the common data line is larger than that of the bit line, as a result of the electric-charge redistribution, the potential of the bit line /BL is raised from a Low level. In case the nMOS transistor 43 has a relatively low threshold voltage (Vt), when a potential of the bit line /BL exceeds the threshold voltage (Vt) of the nMOS transistor 43, the nMOS transistor 43 changes from a non-conductive state (OFF state) to a conductive state (ON state). As a result, the bit line BL is electrically connected to the source common line NCS via the nMOS transistor 43 which is turned electrically conductive and the potential of the bit line BL is decreased from a High level to a Low level. Consequently, the pMOS transistor 46 changes from a non-conductive state to a conductive state, the bit line /BL is connected to the common source line PCS via the pMOS transistor 46 which is turned electrically conductive and the potential of the bit line /BL is raised to a High level. The fact that the nMOS transistor 44 and the pMOS transistor 45 have changed from a conductive state to a non-conductive state indicates that data latched by the sense amplifier (SA) has been inverted.

The lowering of an operating voltage of a sense amplifier, resulting from the advancement of miniaturization in semiconductor processing and reduction of a power supply voltage, may further decrease a noise margin of the sense amplifier.

As a result, it is becoming increasingly difficult to reconcile ensuring a noise margin of a sense amplifier to have a sufficient signal amount of the common data line (data bus) in a read operation and increasing a write speed in a write operation.

More specifically, for example, in order to increase the write speed in a write operation, the semiconductor device is required to have some means or control method for quickly inverting a sense amplifier retaining data corresponding to cell data of a memory cell, a value of which is opposite (or complementary) to that of write data supplied to common data line pair. However, on the other hand, if the sense amplifier should be adapted to be able to be inverted at high speed by the means or control method, data latched by the sense amplifier may be easily inverted by a noise generated in a read operation, thus resulting in a decrease of the noise margin of the sense amplifier that operates at a low voltage. Namely, the means or control method above described is, so to speak, a double-edged sword.

<Patent Document 1>

Patent Document 1 found through a related art search conducted by the applicant discloses a semiconductor memory device including a clock buffer generating a control signal in response to a clock signal; a column selection signal control unit generating a column selection control signal in response to the control signal and a column address enable signal that controls a column address signal in a read access and generating a column selection control signal which is delayed by a certain time from the column selection control signal generated in reading, in response to the control signal, the column address enable signal, and a write control signal in a write access; a column decoder generating a column selection signal in response to the column selection control signal and the column address signal; and a column selection gate sending data externally supplied to a sense amplifier in response to the column selection signal and sending data outputted from a sense amplifier to the outside. According to Patent Document 1, a YS signal activation timing is varied depending on reading or writing, so that activation of the YS signal in a write operation is delayed, as compared with activation of the YS signal in a read operation. Consequently, the substantive write time can be extended, and the write operating margin can be improved.

The above configuration of Patent Document 1 cannot solve the problem of reduction of the noise margin of a sense amplifier operating at a low voltage in a read operation.

SUMMARY

As described above, because of the advancement of miniaturization of a semiconductor and lowering of its operating voltage, it is increasingly becoming difficult to reconcile ensuring a noise margin of a sense amplifier in a read operation and increasing a write speed in a write operation.

The present invention, which seeks one or more of the above problems, may be outlined as follows, though not limited thereto.

According to an aspect of the present invention, there is provided a semiconductor device including:

a plurality of sense amplifiers, each retaining data from a sensed memory cell in a volatile manner;

a plurality of transistors causing selectively the sense amplifiers to be electrically connected to a data bus, in accordance with an input address;

a write amplifier (write driver) connected to the data bus; an external terminal outputting data from the memory cell to the outside via the sense amplifier, the transistors, and the data bus in a first operation (read) mode and outputting data supplied from the outside to the sense amplifier via the write amplifier, the single data bus, and the transistors in a second operation (write) mode; and a control circuit supplying a potential to a gate electrode of first transistor of the transistors that is selectively turned electrically conductive in accordance with the input address, the potential being different depending on the first operation mode or the second operation mode. In the first operation mode, the control circuit supplies a first potential to the gate electrodes of the first transistors, so that the first transistors exhibit a first impedance value. In the second operation mode, the control circuit supplies a second potential to the gate electrodes of the first transistors, so that the first transistors exhibit a second impedance value, an absolute value of which is lower than that of the first impedance value.

In addition, according to another aspect of the present invention, there is provided a semiconductor device including:

a plurality of memory cells storing a plurality of items of data;

a plurality of sense amplifiers retaining the plurality of items of data sensed in a volatile manner;

a plurality of data buses corresponding respectively to the plurality of sense amplifiers and relating to a plurality of external terminals inputting and outputting the plurality of items of data to and from the outside of the semiconductor device;

a plurality of transistors having a gate electrodes and controlling electrical connection between the plurality of sense amplifiers and the plurality of data buses based on a voltage applied to the gate electrodes thereof;

a plurality of write amplifiers arranged to correspond to the plurality of data buses and writing data supplied from the external terminals into the memory cells via the data buses and the sense amplifiers; and a control circuit supplying a potential to a gate electrode of the transistor that is selectively turned electrically conductive in accordance with the input address. In a first operation mode in which data retained by the sense amplifiers in a volatile manner is transferred to the data buses, the control circuit applies a first potential to the gate electrode of the transistor selected and causes the transistor to be turned electrically conductive. In a second operation mode in which data retained by the sense amplifiers in a volatile manner is rewritten by data supplied from the write amplifiers via the data buses, the control circuit applies a second potential higher than the first potential applied to the gate electrode of the transistor selected and causes the transistor to be turned electrically conductive.

According to the present invention, a decrease of the noise margin of a sense amplifier in a read operation is prevented.

In addition, according to the present invention, it is possible to reconcile ensuring a noise margin of a sense amplifier in a read access and increasing a write speed in a write access. Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 6A and 6B are diagrams showing operation waveforms in a read operation and in a write operation, respectively, according to the first exemplary embodiment of the present invention.

PREFERRED MODES

Figure 1:
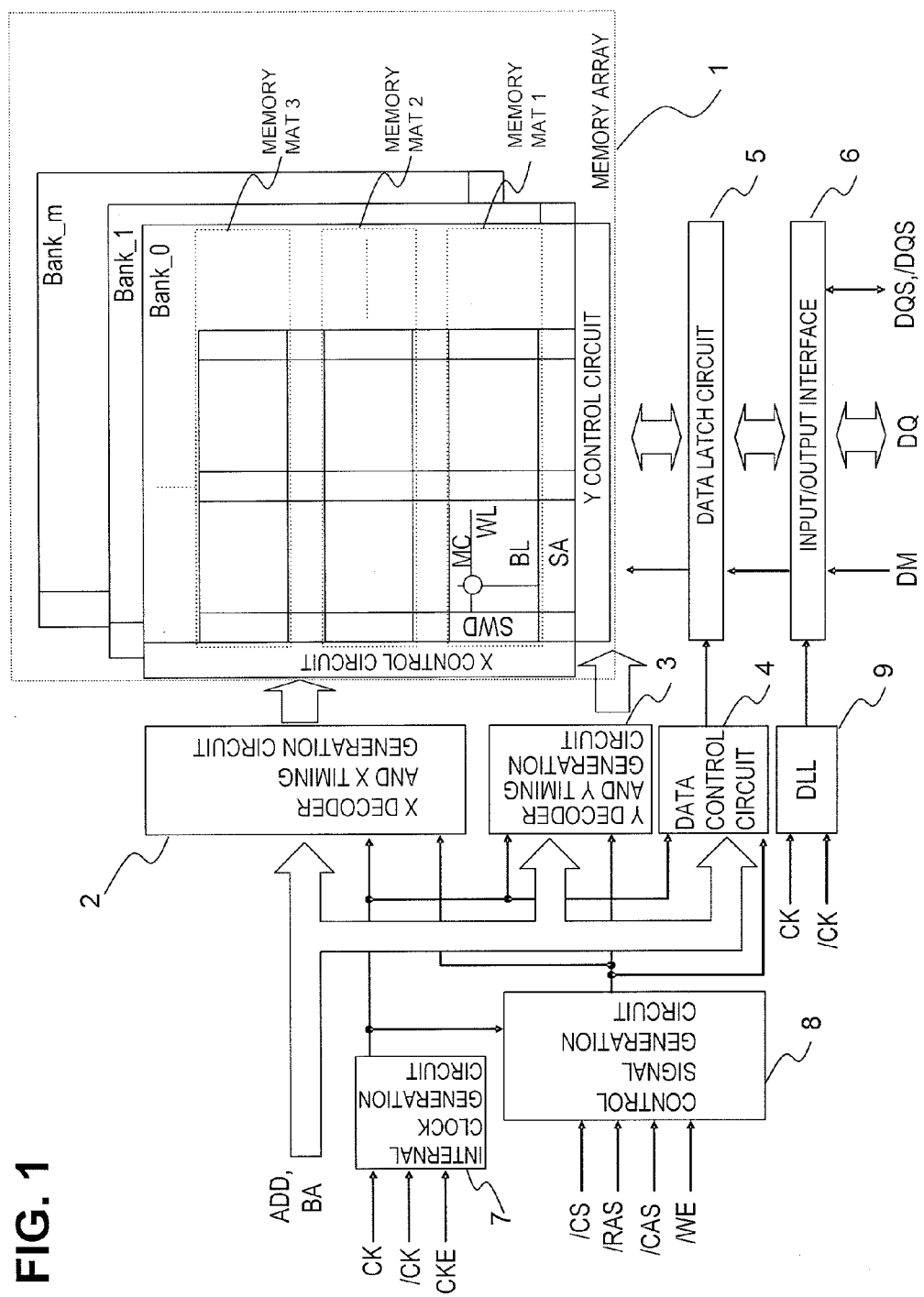
FIG. 1 is a diagram showing a configuration of a semiconductor memory to which the present invention is applied.

One of representative examples of preferred modes of the present invention that achieves at least one of the above mentioned problems will be hereinafter described. However, needless to say, what is claimed by the present application is not limited to these preferred modes but defined in the claims of the present application. A semiconductor device according to one of the preferred modes of the present invention includes a circuit (see FIGS. 5A and 5B) applying a voltage (voltage of a selected column selection signal YS) to a gate node of a column switch (CSW) which selectively connects a sense amplifier (SA) and a data bus (common data line pair CDL and /CDL). This circuit outputs a voltage level for a read access different from a voltage level for a write access. It should be noted that the sense amplifier may be defined as a circuit capable of retaining sensed data in a volatile manner. Namely, the sense amplifier may include the above mentioned sense amplifier 1 or 2.

The sense amplifier 1 may be included in a semiconductor device such as an SRAM or a DRAM, for example. The semiconductor device includes a plurality of memory cells (MC) that store a plurality of items of memory cell data, a plurality of sense amplifiers (SA) that sense the plurality of items of memory cell data and retain data in a volatile manner, a plurality of data buses (a plurality of common data line pairs CDL and /CDL) corresponding to the plurality of sense amplifiers (SA), a plurality of transistors (column switch CSW of FIG. 4), each of which has a gate electrode supplied with a control signal to control electrical connection between a corresponding one of the plurality of sense amplifiers (SA) and a corresponding one of the plurality of data buses (common data line pair CDL and /CDL), depending on a voltage applied to the gate electrode, and a plurality of write amplifiers (write drivers WD of FIG. 9), each of which is arranged for a corresponding one of the plurality of data buses and writes data supplied from the outside into a corresponding one of the plurality of memory cells via a corresponding one of the sense amplifiers. In a first operation mode (read mode) where data retained by the sense amplifier (SA) is transferred to the data bus, a first potential (VDDL) is applied to the gate electrode of the transistor (column switch CSW) selected. In a second operation mode (write mode) where data retained by the sense amplifier (SA) is rewritten by data supplied from the write amplifier (WD of FIG. 9) via the data bus, a second potential (VDDH) higher than the first potential is applied to the gate electrode of the transistor (column switch CSW) selected.

The sense amplifier 2 is included in a semiconductor device having nonvolatile memory cells, such as a flash memory, a resistance random access memory (ReRAM), a phase change random access memory (PCRAM), a magnetic random access memory (MRAM), or a ferroelectric random access memory (FeRAM). The semiconductor device includes a plurality of memory cells that store a plurality of items of data, respectively, a plurality of sensing circuits (not illustrated) that perform sensing of data of the plurality of memory cells, a plurality of sense amplifiers (latch circuits), each of which retains data outputted from a corresponding one of the plurality of sensing circuits in a volatile manner, a plurality of data buses, each of which corresponds to each of the plurality of sense amplifiers, a plurality of transistors, each of which has a gate electrode supplied with a control signal and controls electrical connection between a corresponding one of the plurality of sense amplifiers (SA) and a corresponding one of the plurality of data buses depending on a voltage applied to the gate electrode thereof, and a plurality of write amplifiers each of which is arranged for a corresponding one of the plurality of data buses and writes data supplied from the outside in a corresponding one of the plurality of sense amplifiers (latch circuits). In a first operation mode where data retained by the sense amplifier (latch circuit) is transferred to the data bus, a first potential is applied to the gate electrode of the transistor selected. In a second operation mode where data retained by the sense amplifier (latch circuit) is rewritten by data supplied from the write amplifier via the data bus, a second potential higher than the first potential is applied to the gate electrode of the transistor selected. For example, the sensing circuit is of a current sensing amplifier type.

According to a mode of the present invention, in a write operation, the gate voltage (YS) of a selected column switch is set to a second voltage (VDDH of FIG. 5B), which is higher than a first voltage (VDDL of FIG. 5B) applied to the gate of a selected column switch in a read operation. This control can prevent inversion of data retained by a sense amplifier in a read operation (that is, prevent a decrease of a noise margin of the sense amplifier) and can increase the speed at which data is written from a data bus to a sense amplifier (latch circuit) that retains data in a volatile manner.

Further, according to one of modes of the present invention, the semiconductor device is adapted to support a data mask function. When the data mask function is used in a write operation to mask part of the write data, a write driver driving the masked write data to a common data line is controlled to be turned electrically non-conductive (OFF) and to have an output set in a high-impedance state. As a result, the masked data is not written in a memory cell. According to one of modes of the present invention, plurality of memory cells corresponding respectively to a plurality of simultaneously masked write data are arranged in the same block, and corresponding column switches are controlled by a common column selection signal.

According to one of modes of the present invention, in a write operation, a column selection signal that selects a column switch in a masked block is not outputted. Namely, the column switches corresponding to the masked sense amplifiers are controlled so as not to be turned electrically conductive (ON) (see FIG. 7B).

Figure 8A:
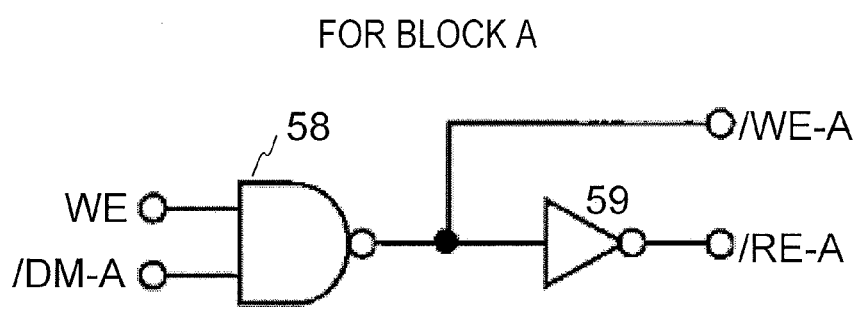
FIGS. 8A and 8B are diagram showing circuit configurations of a column decoder according to a first variation of the second exemplary embodiment of the present invention.
Figure 8B:
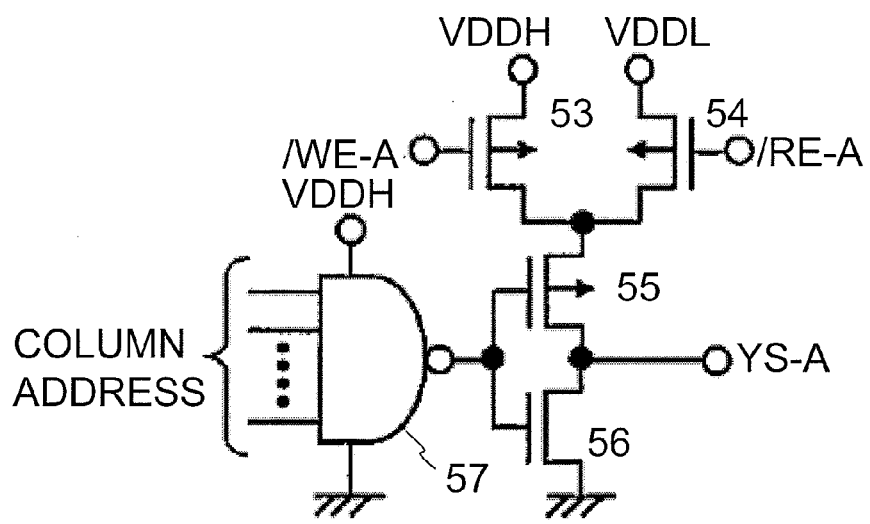

Alternatively, according to another one of mode of the present invention, a column selection signal that selects the column switches corresponding to the sense amplifiers in a masked block may be set to have the first voltage (VDDL) used in a read operation (see FIGS. 8A and 8B).

Figure 9:
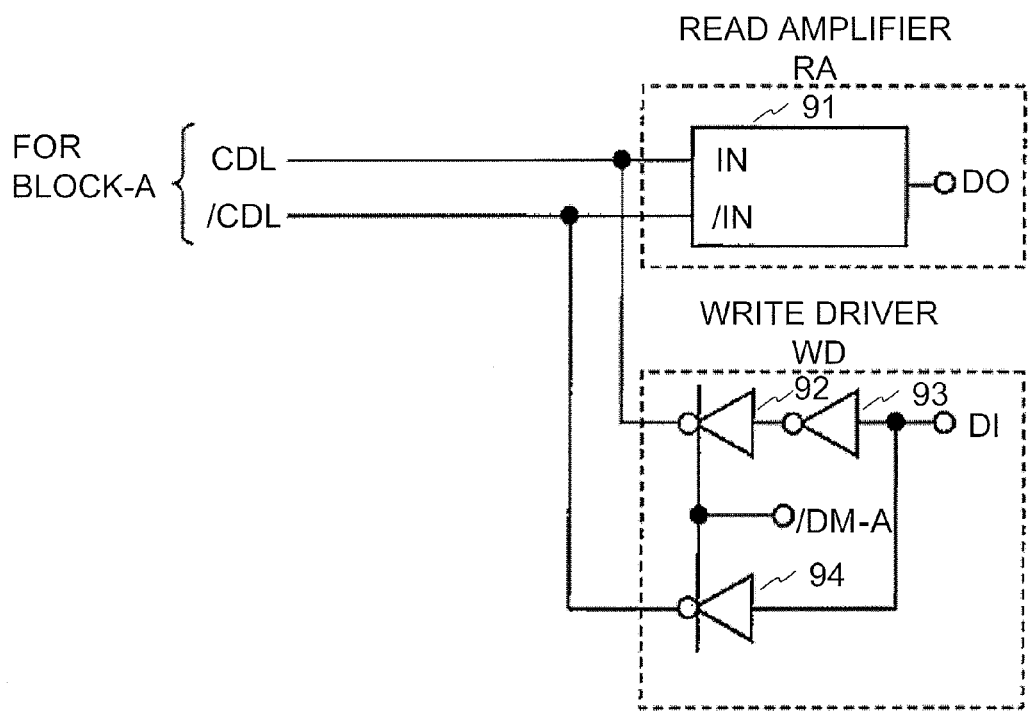
FIG. 9 is a diagram showing a configuration of a write driver according to a second variation of the second exemplary embodiment of the present invention.

Alternatively, according to further one of modes of the present invention, the common data line corresponding to the masked sense amplifier may be set in a floating state (see FIG. 9).

Thus, the semiconductor device according to the present invention comprises a memory circuit including a sense amplifier that latches information read from a memory cell, a common data line pair; a column switch (a MOS switch) that selects connecting the sense amplifier and the common data line. The gate voltage of the column switch is set to be the first voltage (VDDL) in a read operation and to be the second voltage (VDDH) different from the first voltage in a write operation.

According to the present invention, in case the column switch is formed by an nMOS transistor, the second voltage (VDDH) is set to be higher than the first voltage (VDDL).

Alternatively, according to the present invention, in case the column switch is formed by a pMOS transistor, the second voltage applied in a write operation is set to be lower than the first voltage applied in a read operation.

<Principles of Operation>

One of the principles of operation of the present invention will be hereinafter described. Needless to say, what is claimed by the present application is not limited to this principle of operation.

As described above, to increase a write speed, it is necessary to increase a speed at which a sense amplifier retaining data opposite to write data is inverted. In a read operation, while data amplified and retained by a sense amplifier is transferred to a data bus (common data line pair CDL and /CDL), based on an initial potential of this data bus (the initial potential is a pre-charge potential V and an mount of electric charge Q1=CV, where V is the pre-charge potential and C is a parasitic capacitance of the data bus and Q1 is, for example, more than 10 times as great as an mount of electric charge Q in the sense amplifier), disturbance to invert the data retained by the sense amplifier connected to the data bus is exerted.

According to the present invention, in a write operation, the gate voltage of the column switch (column select transistors) is set to be a second voltage higher than a first voltage applied in a read operation. In this way, an impedance of the column switch (column select transistors) when the column switch is conductive, is decreased, and the write speed is increased.

In a write operation, while a column switch is caused to be turned electrically conductive and is connected to a data bus (common data line pair CDL and /CDL) (transfers the potential of a sense amplifier), there is a case where a write amplifier connected to a data bus (common data line pair CDL and /CDL) corresponding thereto is caused to be inactive (data is inhibited). This is referred to as a data mask function, which is used in a write operation.

In a write operation, there is a case where a data bus to which the data mask function is applied and a data bus to which the data mask function is not applied exist at the same time. In this case, since a write amplifier corresponding to the data bus to which the data mask function is applied is made inactive, the sense amplifier can only execute a read operation. This is referred to as a refresh operation. While the gate potential of the column switch is raised to speed up the write access, the initial potential (pre-charged potential, or equalized potential) of the data bus disturbs the sense amplifier that executes a refresh operation. The amount of such disturbance is increased with an increase of the gate potential of the selected column switch (with a decrease of an impedance of the column switch that is conductive). Thus, according to the present invention, a column decoder controlling column switches to which the write mask function is applied and a column decoder controlling column switches to which the write mask function is not applied are separately arranged (addresses are allocated so that data is written in different blocks in the order of a burst write, and in FIGS. 2 and 7A, which will be described in detail below, column decoders are allocated for blocks A to D in the order of a burst write). In this way, the column decoder, to which the write mask function is applied, are controlled to be inactive. Next, the present invention will be described based on exemplary embodiments.

<Overall Configuration of DRAM>

FIG. 1 is a diagram for illustrating a configuration example of a semiconductor device to which the present invention is applied. FIG. 1 is a block diagram illustrating a configuration of a general DRAM. The semiconductor device includes a memory array 1, an X decoder (row decoder) and X timing generation circuit 2, a Y decoder (column decoder) and Y timing generation circuit 3, a data control circuit 4, a delay locked loop (DLL) 9, a data latch circuit 5, an input/output (I/O) interface 6, an internal clock (CLK) generation circuit 7, and a control signal generation circuit 8. The memory array 1 includes banks 0 to m each including memory mats 1 to 3. Needless to say, the configuration of the bank and memory mats in the banks of the semiconductor device is not limited to the above configuration. The control signal generation circuit 8 receives a command signal (chip select /CS, row address strobe /RAS, column address strobe /CAS, and write enable /WE). The control signal generation circuit 8 decodes the command, generates control signals based on the decoded result of the command and outputs the control signals to the X decoder (row decoder) and X timing generation circuit 2, the Y decoder (column decoder) and Y timing generation circuit 3, and the data control circuit 4. The slash mark "/" that precedes the name of each of the control signals indicates that the signal indicates active at a Low level.

The X decoder 2 decodes a row address of a received address signal (ADD) and a sub-word driver (SWD) selects and activates a word line WL. When the word line WL is selected, a plurality of items of data retained by the memory cells (MCs), each including a cell transistor having a gate connected to the selected word line WL, is transferred to bit lines (BL) and amplified by sense amplifiers (SA). The Y decoder 3 decodes a column address of the address (ADD) and activates a column selection signal selected to make a selected column switch (not shown in FIG. 1) provided in the Y control circuit conductive, thereby connecting a sense amplifier (SA) of a selected bit line to a common data line pair (not shown in FIG. 1).

The output (read data) amplified by the sense amplifier (SA) is transferred to a common data line pair (not shown in FIG. 1) via the Y control circuit (including a column switch). Next, the data is amplified by a read amplifier (not shown), and the amplified data is transferred to the data latch circuit 5 and the I/O interface 6. The data is outputted to the outside from a DQ pin. The DQ pins (DQ terminals) includes a plurality of pins (a plurality of I/O terminals).

Data strobe signals DQS and /DQS are trigger signals for latching data supplied from the outside.

A data mask signal DM is a control signal for masking data. If the data mask signal DM is set to a High level when data is inputted, writing of the data into a memory cell is masked (inhibited). Namely, the data is not written. A plurality of data mask signals DM are provided, and the data mask signals DM are inputted via external terminals of the semiconductor device. Each of the data mask signals DM is associated with one of a plurality of groups, each group being formed by a plurality of corresponding DQ terminals.

To write data into a memory cell, the data mask signal DM is set to be Low, and data is supplied to a DQ pin. The write data is then transferred to a write driver (not shown in FIG. 1), a column switch in the Y control circuit, and a sense amplifier (SA), via the I/O interface 6 and the data latch circuit 5.

The sense amplifier (SA) drives a bit line (BL) based on the write data and write the data in a memory cell that is connected to the bit line (BL) and to a selected word line.

<Configuration of Memory Bank>

Figure 2:
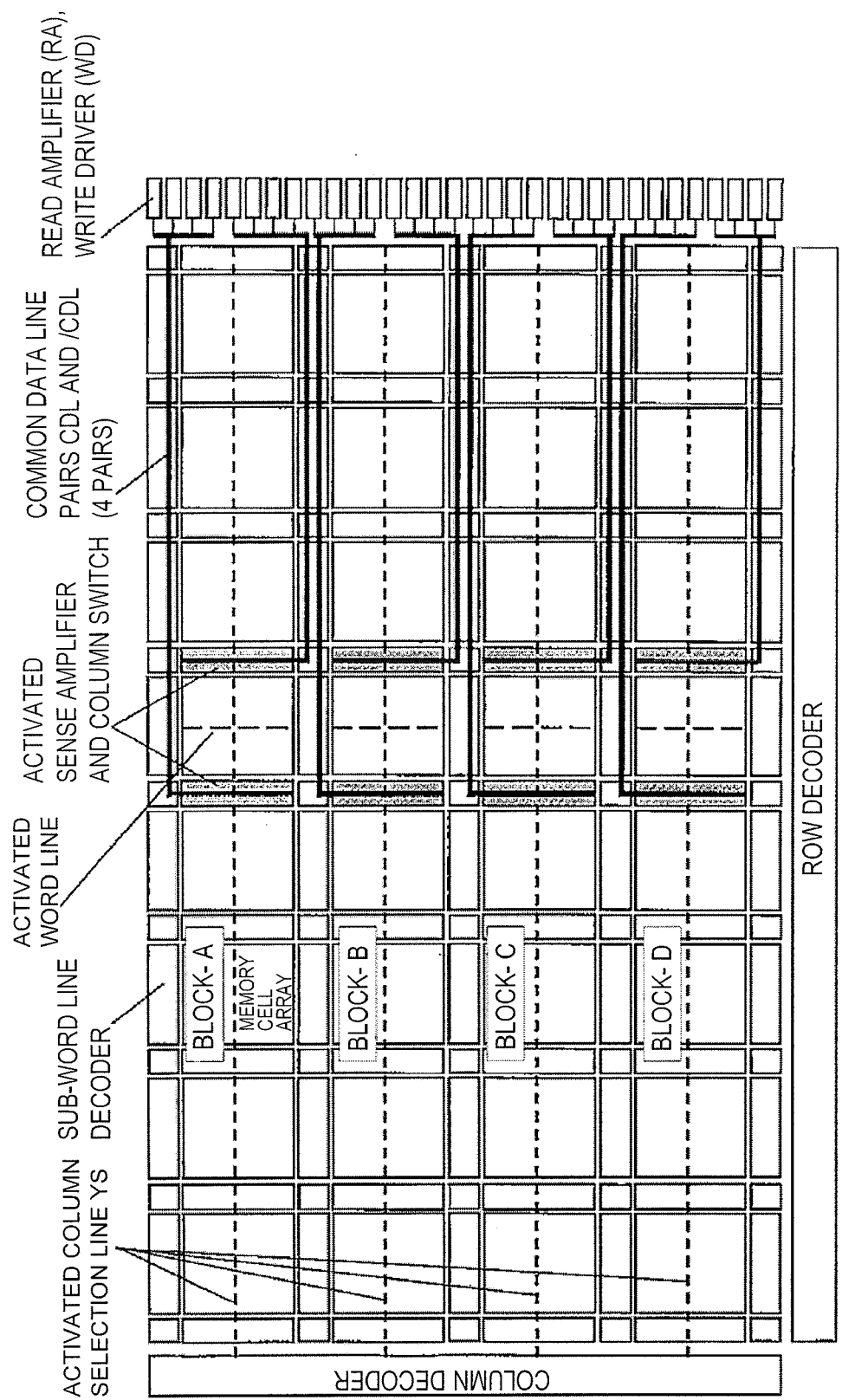
FIG. 2 is a diagram showing a configuration of a main part of the semiconductor memory such as a DRAM to which the present invention is applied.

FIG. 2 illustrates schematically a configuration of a main part of the semiconductor memory such as a DRAM to which the present invention is applied. Referring to FIG. 2, sense amplifiers and column switches are arranged on the right and left sides of each memory cell array and sub-word line decoders (SWD in FIG. 1) are arranged on the top and bottom of each memory cell array. Eight memory cell arrays, each having the configuration above described as a unit, are arranged consecutively in a horizontal direction in FIG. 2 to form a single block (memory mat row). By arranging four blocks in a vertical direction in FIG. 2, one memory bank is configured. For convenience, these four blocks will be hereinafter referred to as blocks A to D.

A memory bank includes a row decoder (X decoder in FIG. 1) that selects a word line and a column decoder (Y decoder in FIG. 1) that selects a column selection signal YS.

The row decoder and the sub-word line decoders select and activate a word line, based on row address information supplied from the outside. The row decoder selects a main word line, and the sub-word line decoders select one of a plurality of word lines (sub-word lines) provided in correspondence with the selected main word line.

The column decoder selects and activates one of the column selection signals YS, each arranged for a block, based on column address information supplied from the outside.

When the selected word line is activated, sense amplifiers amplify and latch memory cell information read to bit lines respectively from memory cells connected to the selected word line.

In a read operation, the information amplified and latched by the sense amplifier is transferred to a common data line pair (CDL and /CDL) via a column switch that is turned electrically conductive (ON) by a column selection signal YS. Then, the information transferred to the common data line pair (CDL and /CDL) is amplified by a read amplifier (RA) and outputted to the outside from the DQ pin.

In a write operation, a write driver (WD) drives a common data line pair (CDL and /CDL) in accordance with write information supplied from the outside. A sense amplifier and a bit line are driven via a column switch which is controlled to be turned electrically conductive (ON) by a column selection signal YS, the write driver (WD) writes the information in a selected memory cell.

An activated column selection signal YS causes eight column of switches in a block to be turned electrically conductive (ON), to connect eight sense amplifiers and bit line pairs to eight pairs of common data lines. As a result, in a single read or a single write operation, 32-bit information (4 blocks in total) is simultaneously accessed. Each pair of the eight pairs of common data lines is connected to a corresponding one of a plurality of a read amplifier RA and to a corresponding one of a plurality of write amplifiers WD included in the data latch circuit 5 (FIG. 1) arranged outside the memory array 1. Each of the plurality of read amplifiers RA and each of the plurality of write amplifiers WD communicates with a corresponding one of the plurality of external terminals DQ via the I/O interface 6 (FIG. 1).

<Connection Configuration of Data Paths in FIG. 2>

Figure 3:
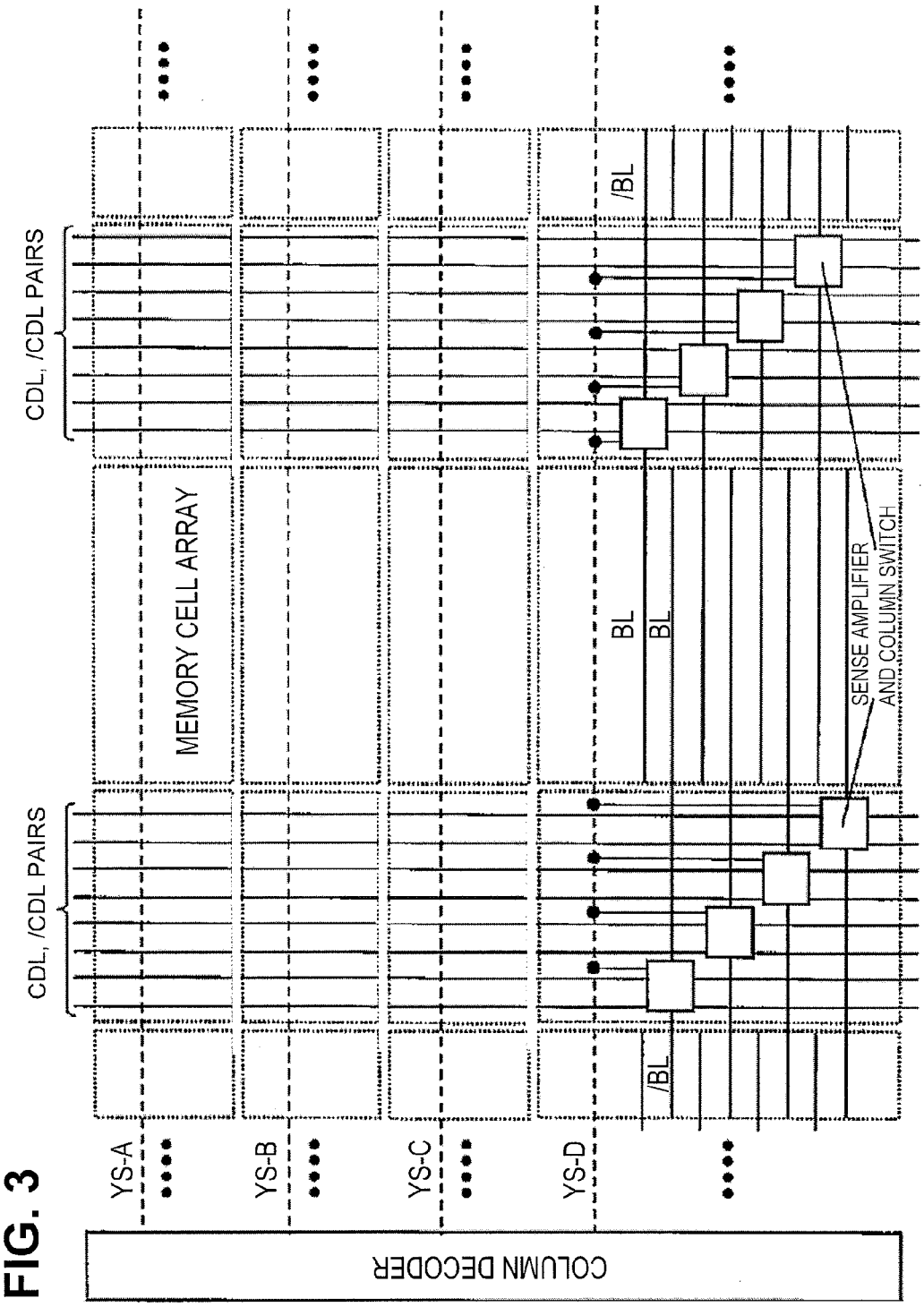
FIG. 3 is a diagram showing connection of data paths of FIG. 2.

FIG. 3 illustrates connection of the column selection lines YS, the common data line pairs CDL and /CDL, the sense amplifiers SA, and the column switches CSW of FIG. 2 to the bit line pairs BL and /BL. In FIG. 3, the column selection lines YS are arranged for the blocks A to D and are denoted by YS-A, YS_B, YS_C, and YS_D, respectively.

A bit line pair BL and /BL sandwiches a sense amplifier and extends in a horizontal direction in FIG. 3. As illustrated in the example of FIG. 3, which does not particularly limit the present invention, a set of a sense amplifier and a column switch are connected to a bit line pair BL and /BL that extend respectively in the memory cell arrays provided on opposite (right and left) sides of the sense amplifier and located in the same column. Four set of common data line pairs CDL and /CDL are arranged on each of the right and left sides of a memory cell array, and the sense amplifier (bit line pair) corresponding to the column switch selected by the column decoder is connected to the common data line pair CDL and /CDL.

In addition, as illustrated in FIG. 3, a YS line (YS_D, for example) selects eight sense amplifiers (in block D, for example), and the selected sense amplifiers are connected to eight pairs of common data lines via eight column switches.

<Sense Amplifier and Column Switch>

Figure 4:
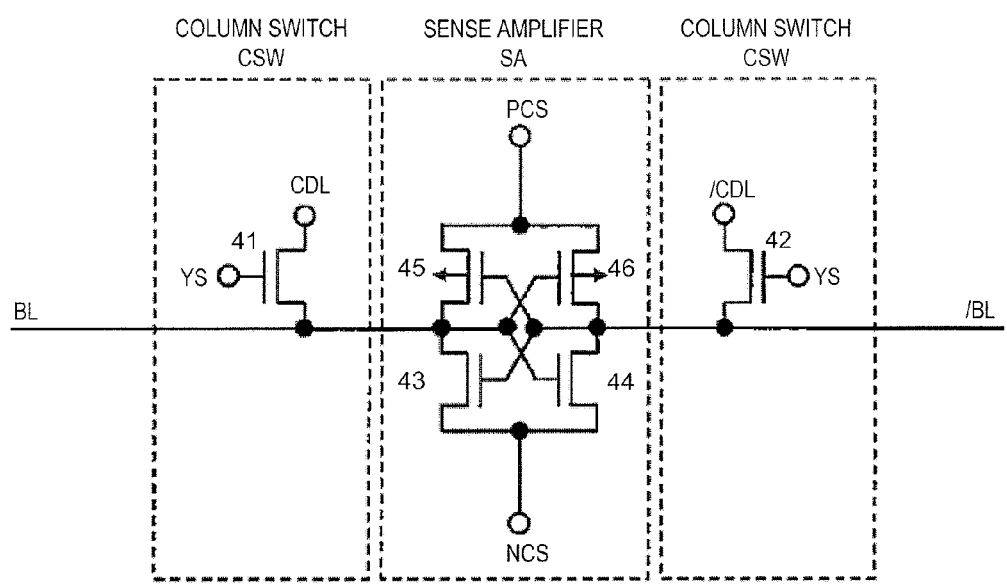
FIG. 4 is a diagram showing a circuit configuration of a sense amplifier and a column switch of FIG. 3.

FIG. 4 illustrates a circuit configuration example of a sense amplifier SA and a column switch CSW in FIG. 3. In FIG. 4, the column switch CSW includes a pair of nMOS transistors 41 and 42, each having a gate connected to a column selection line YS. The nMOS transistor 41 has a drain connected to the common data line CDL and a source connected to the bit line BL. The nMOS transistor 42 has a drain connected to the common data line /CDL and a source connected to the bit line /BL. The column switch CSW connects the selected bit line pair BL and /BL to the common data line pair CDL and /CDL.

The sense amplifier SA is composed by a CMOS dynamic cross-coupled latch type amplifier, as described above. The sense amplifier SA includes nMOS transistors 43 and 44 having sources connected to a common source line NCS. The nMOS transistors 43 and 44 have drains connected to the bit line pair BL and /BL and gates cross-connected to the bit lines /BL and BL, respectively. The sense amplifier SA also includes pMOS transistors 45 and 46 having sources connected to a common source line PCS. The pMOS transistors 45 and 46 have drains connected to the bit line pair BL and /BL and gates cross-connected to the bit lines /BL and BL, respectively. The sense amplifier SA is driven by the common source line PCS connected to the pMOS transistors 45 and 46 and by the common source line NCS connected to the nMOS transistors 43 and 44. Since the sense amplifier SA has already been described in the BACKGROUND, the description of operations thereof will be omitted.

<Column Decoder>

Figure 5A:
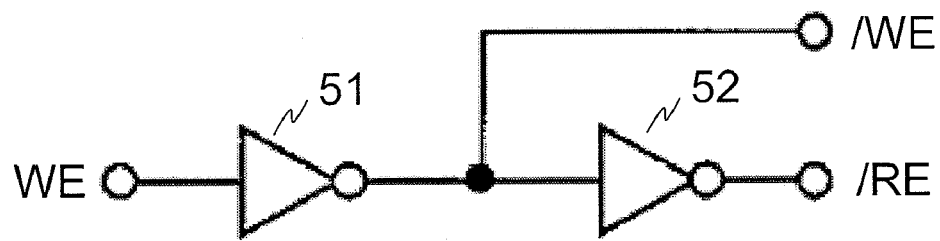
FIGS. 5A and 5B are diagram showing circuit configurations of a column decoder according to a first exemplary embodiment of the present invention.
Figure 5B:
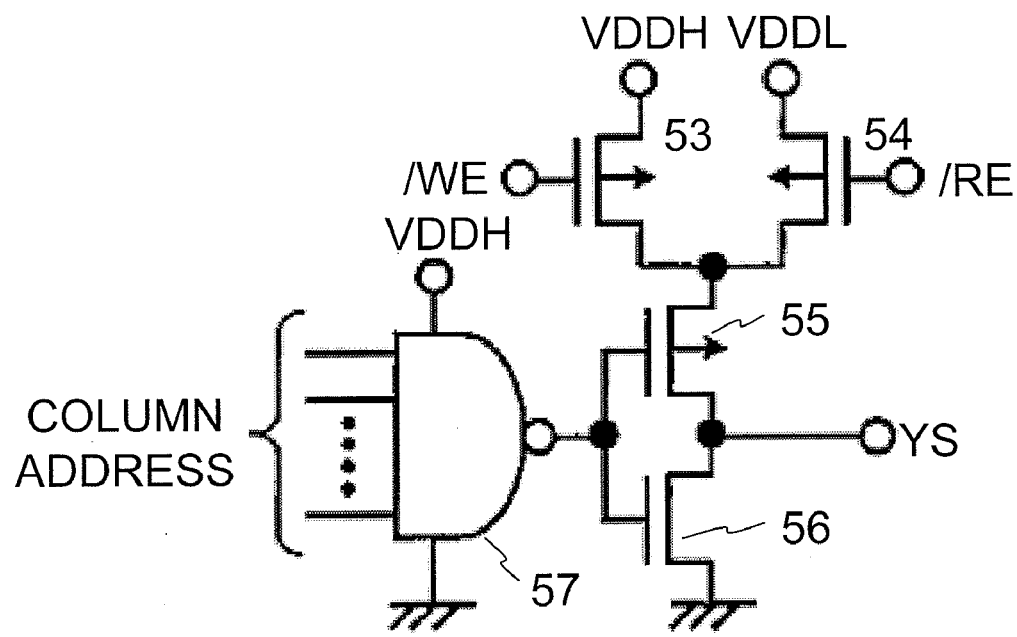

FIGS. 5A and 5B illustrate configuration examples of the column decoder according to the first exemplary embodiment of the present invention. This column decoder corresponds to the column decoder of FIGS. 2 and 3 and to the Y decoder of FIG. 1. FIG. 5A illustrates a configuration of a circuit (control signal generation circuit) that generates a read enable signal /RE and a write enable signal /WE from a write control signal WE. In FIG. 5, the slash mark "/" that precedes the name of each of the signals indicates that the signal is active at Low. The control signal generation circuit of FIG. 5A may be incorporated in the control signal generation circuit 8 of FIG. 1. In this case, since the control signal generation circuit 8 of FIG. 1 receives the write enable signal /WE, which is activated at a Low level, an inverter 51 of FIG. 5A is unnecessary, and the read enable signal /RE is outputted via an inverter 52 as an inverted signal of the write enable signal /WE. A received write enable signal /WE may be inverted in the control signal generation circuit 8 of FIG. 1 to generate the write control signal WE of FIG. 5B.

The write control signal WE is set to a Low level in a read operation and to a High level in a write operation. The write enable signal /WE is obtained by inverting the write control signal WE by the inverter 51, and the read enable signal /RE is obtained by inverting the output from the inverter 51 by the inverter 52. The read enable signal /RE is set to a Low level when reading and the write enable signal /WE is set to a Low level when writing.

As illustrated in FIG. 5B, the column decoder receives a plurality of column address signals. When a combination of values of these column address signals corresponds to a predetermined combination, the column decoder sets a corresponding column selection signal YS to a High level. In FIG. 5B, the column decoder is schematically illustrated as a multi-input logic circuit (NAND circuit) 57. When all of the plurality of column address signals are set to a High level, the column selection signal YS is selected and activated to a High level. In such a configuration wherein when certain bits of the plurality of column address signals are set to a Low level and the other bits are set to a High level, the column selection signal YS is selected, input terminals corresponding to the certain bits of the column address signals of the NAND circuit 57 have negative logic inputs (active Low inputs). Namely, when the number of column address signals is m, the NAND circuit 57 of FIG. 5B decodes all the combinations ($2^m$ combinations).

The NAND circuit 57 has an output end connected to a gate of an nMOS transistor 56 having a source connected to a power supply VSS (ground potential). The output end of the NAND circuit 57 is also connected to a gate of a pMOS transistor 55 having a drain connected to a drain of the nMOS transistor 56. A pMOS transistor 54 is connected between a source of the pMOS transistor 55 and the first voltage VDDL, and a pMOS transistor 53 is connected between the source of the pMOS transistor 55 and the second voltage VDDH. The write enable signal /WE and the read enable signal /RE are supplied to gate electrodes of the pMOS transistors 53 and 54, respectively.

When the output from the logic circuit (NAND circuit) 57 that receives a plurality of column address signals is at a Low level, the pMOS transistor 55 is turned electrically conductive (ON). In this state, in a read operation, the read enable signal /RE and the write enable signal /WE are set to be Low and High levels, respectively. Thus, the pMOS transistor 54 is turned electrically conductive (ON) and the pMOS transistor 53 is set non-conductive (OFF). Consequently, the column selection signal YS is set to the first voltage VDDL. On the other hand, in a write operation, the read enable signal /RE and the write enable signal /WE are set to be High and Low levels, respectively. Thus, the pMOS transistor 53 is turned electrically conductive (ON) and the pMOS transistor 54 is turned electrically non-conductive (OFF). Consequently, the outputted column selection signal YS is set to the second voltage VDDH.

<Operation Waveforms>

FIGS. 6A and 6B illustrate signal waveforms in read and write operations, respectively, according to the first exemplary embodiment of the present invention. More specifically, FIG. 6A illustrates voltage waveforms of a bit line pair BL and /BL, a common data line pair CDL and /CDL, and a column selection line YS in reading High level information (High information).

Information read from a memory cell is amplified by a sense amplifier (SA). The bit line BL is latched at a High level (Bit Line High level=VBLH) and the bit line /BL is latched at a Low level (ground potential VSS).

When the column selection line YS rises from the ground potential VSS to the first voltage VDDL, the potential of the common data line /CDL is decreased toward that of the bit line /BL. As a result, a read signal appears as the potential difference between the common data line pair CDL and /CDL. This potential difference is amplified by the read amplifier (RA of FIG. 2) and is then outputted from a DQ pin to the outside.

When reading High information, the potential of the bit line /BL rises from the ground potential VSS. When the nMOS transistor (42 of FIG. 4) of the column switch has a relatively lower threshold voltage Vt and the nMOS transistor (44 of FIG. 4) of the sense amplifier (SA) has a relatively higher threshold voltage Vt, the potential of the bit line /BL rises more greatly. As a result, the information latched by the sense amplifier (SA) is easily inverted. The greater the high potential of the column selection line YS is, the more easily the information latched by the sense amplifier (SA) is inverted.

In the present embodiment, the first and second voltages VDDL and VDDH can be set separately. Thus, even if there are variations in a threshold voltage Vt of transistors, without affecting the access speed and without inverting the latched information, the first voltage VDDL (a voltage applied to a gate of the column switch selected when reading) can be set to lower than the second voltage VDDH. As a result, an amount of an increase (rise from VSS) of the potential of the bit line /BL can be controlled.

FIG. 6B illustrates signal waveforms in a write operation (right-side waveforms). More specifically, FIG. 6B illustrates voltage waveforms of a bit line pair BL and /BL, a common data line pair CDL and /CDL, and a column selection line YS when writing Low information in a sense amplifier in which High information is latched.

When the common data line CDL is driven to a Low level based on write information supplied from the outside and when the column selection line YS rises to the second voltage VDDH, the bit line BL is decreased to a Low level and the bit line /BL is driven to a High level (Bit Line High level=VBLH).

According to the exemplary embodiment, the second voltage VDDH can be set separately from the first voltage VDDL, without consideration of the noise margin in a read operation. Thus, according to the present example, the second voltage VDDH can be set to be high so that a necessary write speed can be obtained. Therefore, according to the present example, a decrease in the noise margin of a sense amplifier operating at a low voltage in a read operation can be prevented, and the write speed can be increased.

<Exemplary Embodiment 2>

Figure 7A:
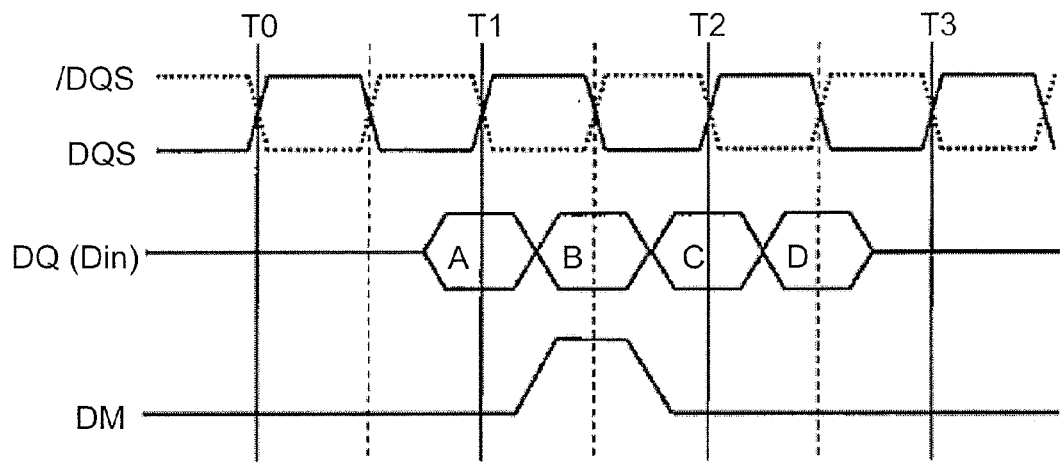
FIGS. 7A and 7B are diagram showing operation waveforms when data is masked and a circuit configuration of a column decoder, respectively, according to a second exemplary embodiment of the present invention.

Next, a second exemplary embodiment of the present invention will be described. FIG. 7A illustrates input signal waveforms during data masking. More specifically, FIG. 7A illustrates voltage waveforms of data strobe signals DQS and /DQS, a data signal DQ (Din), and a data mask signal DM. FIG. 7A illustrates waveforms of a double data rate operation, although not limited thereto. In such double data rate operation, data is sent in synchronization with rising and falling edges of a clock in one clock cycle. As illustrated in the waveforms of FIG. 7A, a 4-bit burst write operation is executed and the second bit data (DQ-B) is masked. The data mask signal DM masks the second bit data (DQ-B) by reaching a High level in synchronization with the second bit data (DQ-B). Namely, since data captured when the data mask signal DM is at a High level is masked, the data is not written in memory cells.

If the data mask function is used in a write operation, no information is written in a masked sense amplifier. According to the second exemplary embodiment, it is possible to control these sense amplifiers so that latched information is not inverted.

According to the second exemplary embodiment, addresses are allocated so that data is written in different blocks in the order of the burst write operation. As illustrated in FIG. 7A, blocks A to D are allocated in the order of the burst write operation. As illustrated in FIG. 2, since each of the blocks A to D can be accessed in 8-bit units, the width of each of the data DQ is set to be 8 bits.

Figure 7B:
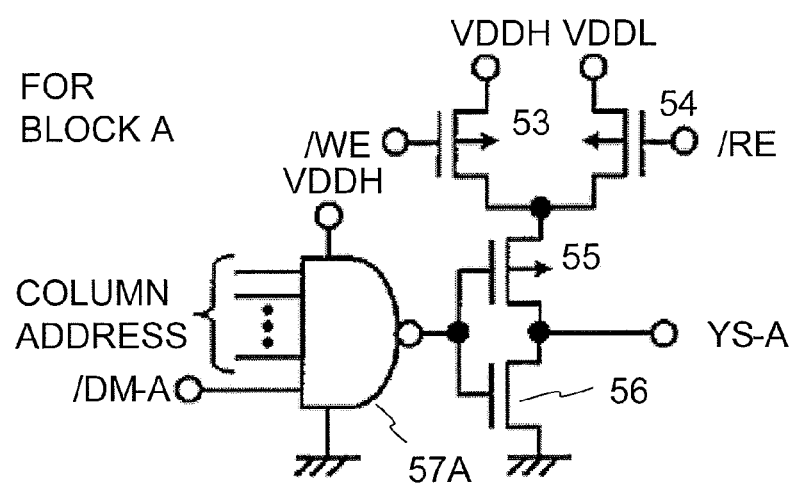

Among the column decoders according to the second example of the present invention, FIG. 7B illustrates a circuit configuration of a block-A column decoder. Referring to FIG. 7B, while the column decoder according to the present exemplary embodiment has a basic configuration identical to that of the column decoder of FIG. 5B, a NAND circuit 57A receives a mask control signal /DM-A in addition to column address signals. The slash mark "/" indicates that the signal is an active Low signal. When the mask control signal /DM-A is Low (active), the output from the NAND circuit 57A is set to be high, irrespective of the column address signal values. As a result, the nMOS transistor 56 is turned electrically conductive (ON) and the column selection signal YS-A is fixed at a Low level. When the mask control signal /DM-A is High, the column decoder operates as the column decoder of FIG. 5B. Namely, the first and second voltages VDDL and VDDH are outputted to the column selection line YS-A in a read operation and a write operation, respectively.

The column decoders in the blocks B to D also have the same configuration as that of the column decoder of FIG. 7B. In addition to column address signals, the multi-input NAND circuits receive mask control signals /DM-B to /DM-D, respectively. When the column selection lines YS-B to YS-D are not selected or are masked, a Low level (VSS) is outputted to the column selection lines YS-B to YS-D, respectively. Further, the first voltage VDDL is outputted to the column selection lines YS-B to YS-D in a read operation, and the second voltage VDDH is outputted to the column selection lines YS-B to YS-D in a write operation (when data is not masked).

When the data mask signal DM is a High level, the mask control signals /DM-A to /DM-D (/DM-B to /DM-D are not illustrated) each provided for a block are controlled to be Low.

As a result, even in a write operation, the column selection line YS in a corresponding block is not activated. Thus, the column switches are not turned electrically conductive (OFF), and hence information latched by each of the sense amplifier in the corresponding block is not inverted.

<First Variation of Exemplary Embodiment 2>

FIGS. 8A and 8B illustrate configurations of a first variation of the second exemplary embodiment of the present invention. FIG. 8B illustrates a circuit configuration of a block-A column decoder.

As illustrated in FIG. 8A, a NAND circuit 58 receives a mask control signal /DM-A and a write control signal WE and outputs a write enable signal /WE-A. In addition, a signal obtained by inverting the output from the NAND circuit 58 by an inverter 59 is outputted as a read enable signal /RE-A. Instead of the mask control signal /DM-A, the NAND circuits 58 of the block-B to -D column decoders receive mask control signals /DM-B to /DM-D and output write enable signals /WE-B to /WE-D and read enable signals /RE-B to /RE-D, respectively.

When the mask control signal /DM-A is controlled to be Low (active), even in a write operation (write control signal WE=High), the write enable signal /WE-A and the read enable signal /RE-A are controlled to be High and Low, respectively. Thus, since the pMOS transistor 54 of FIG. 8B is turned electrically conductive, the high potential of the column selection line YS-A is set to the first voltage VDDL, which is the same voltage applied in a read operation. Therefore, information latched by the sense amplifiers is not inverted.

<Second Variation of Exemplary Embodiment 2>

Among the write driver circuits (write amplifiers) according to a second variation of the second exemplary embodiment of the present invention, FIG. 9 illustrates a circuit configuration of a block-A write driver circuit. When the mask control signal /DM-A is controlled to be Low (active), even in a write operation (write control signal WE=High), the write driver is set in an output high impedance state (Hi-Z), and hence the common data line pair CDL and /CDL is set in a floating state. As a result, information latched by the sense amplifiers is not inverted. Each of the output node DO of a read amplifier RA and the input node DI of a write amplifier WD communicate with a corresponding one of the plurality of corresponding external terminals DQ via the I/O interface 6 (FIG. 1).

<Exemplary Embodiment 3>

Figure 10:
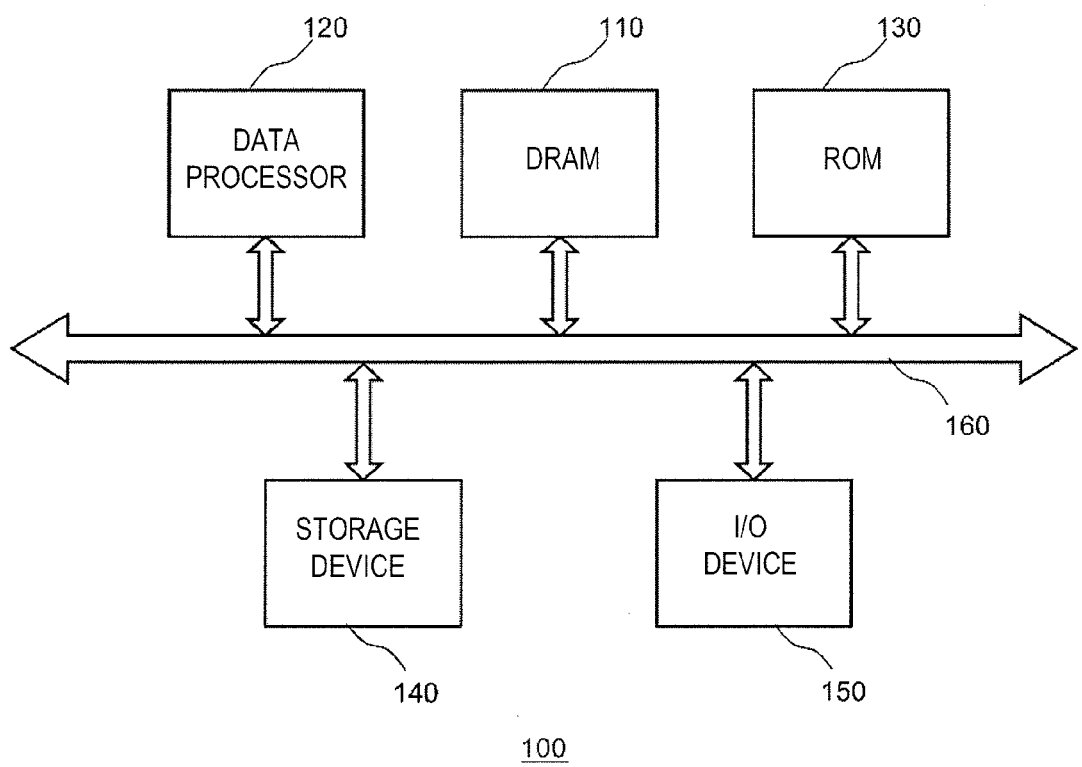
FIG. 10 is a diagram showing a system configuration according to a third exemplary embodiment of the present invention.

FIG. 10 illustrates a configuration of a third exemplary embodiment of the present invention. More specifically, FIG. 10 illustrates a block diagram of a configuration of a data processing system 100 using a semiconductor device (DRAM) 110 as described in the above exemplary embodiments. Referring to FIG. 10, in the data processing system 100, a data processor 120 and the semiconductor device (DRAM) 110 are mutually connected via a system bus 160. For example, the data processor 120 may be a microprocessor (MPU) or a digital signal processor (DSP). However, the data processor 120 is not limited to these examples. In FIG. 10, for ease of description, the data processor 120 and the DRAM 110 are connected via the system bus 160. However, the data processor 120 and the DRAM 110 may be connected to each other via a local bus, instead of the system bus 160.

In addition, for ease of description, FIG. 10 illustrates only a single system bus 160. However, a plurality of system buses 160 may be arranged in serial or parallel via connectors, as needed. In addition, in the data processing system 100 of FIG. 10, while a storage device 140, an I/O device 150, and a ROM 130 are connected to the system bus 160, these devices are not essential components.

Examples of the storage device 140 include a hard disk drive, an optical disk drive, and a flash memory. Examples of the I/O device 150 include: a display device such as a liquid crystal display; and an input device such as a keyboard and a mouse. The I/O device 150 may be either an input device or an output device.

In addition, while FIG. 10 illustrates only a single component for each component type for ease of description, the data processing system 100 is not limited to such example. A plurality of components may be arranged for one or more component types.

A controller (the data processor 120, for example) controlling the DRAM uses the system clocks CK and CKB and other control signals to issue various types of commands relating to read access to data in the DRAM 110. Upon receiving a read command from the controller (the data processor 120, for example), the semiconductor device 110 reads stored information held therein and outputs the data to the system bus 160 via a DQ input/output interface (see the I/O interface 6 of FIG. 1). The commands issued by the controller are known commands (system commands) that control semiconductor devices and that are defined by an industry organization (Joint Electron Device Engineering Council (JEDEC) Solid State Technology Association).

As described above, according to the embodiments of the present invention, a gate voltage of a column switch selectively connecting a sense amplifier (latch circuit) and common data lines used in a volatile or nonvolatile semiconductor memory is set to be higher in a write operation than that set in a read operation. In this way, inversion of data latched by the sense amplifier in a read operation can be prevented and the speed at which data is written from the data bus to the sense amplifier (latch circuit) can be enhanced.

Further, according to the second embodiment of the present invention, in order to respond to a data mask function used in a write operation, memory cells corresponding to a plurality of simultaneously masked data are arranged in a single block, and corresponding column switches are controlled by a column selection signal. Further, a signal for selecting column switches in a masked block is not outputted. Alternatively, the signal for selecting column switches in a masked block is caused to have the same voltage as that set in a read operation. Alternatively, corresponding common data lines are controlled to be in a floating state. In this way, even when a data mask function is used, inversion of data in masked sense amplifiers can be prevented, counted as an advantage. For example, technical concepts of the present invention are applicable to data signal transmission routes in a memory or a data processor.

In addition, sense amplifiers, column decoders, memory banks, data buses, or circuits generating control signals and other signals are not limited to those disclosed in the above embodiments. Technical ideas of the present invention are applicable to various types of semiconductor devices. For example, the present invention is applicable to general semiconductor devices, such as a central processing unit (CPU), a micro control unit (MCU), a digital signal processor (DSP), an application specific integrated circuit (ASIC), an application specific standard product (ASSP), and a memory. Examples of a product form of such semiconductor device to which the present invention is applied include system on chip (SOC), multi-chip package (MCP), and package on package (POP). The present invention is applicable to semiconductor devices having these arbitrary product forms and package forms. In addition, the transistors used in the present invention are not limited to metal oxide semiconductors (MOSs), as long as the transistors are field-effect transistors (FETs). Various types of FETs are applicable, such as metal-insulator semiconductors (MISs) and thin film transistors (TFTs). Parts of a device may include bipolar-type transistors. A PMOS (P-channel MOS) transistor is a typical example of a first conductivity type transistor, and an NMOS (N-channel MOS) transistor is a typical example of a second conductivity type transistor. The disclosure of the above Patent Document is incorporated herein by reference thereto. Modifications and adjustments of the exemplary embodiments and examples are possible within the scope of the overall disclosure (including claims) of the present invention and based on the basic technical concept of the present invention. Various combinations and selections of various disclosed elements are possible within the scope of the claims of the present invention. That is, the present invention of course includes various variations and modifications that could be made by those skilled in the art according to the overall disclosure including the claims and the technical concept.

The above described embodiments of the present invention will be hereinafter listed as notes, though not limited thereto.

(Note 1)

A semiconductor device including:

a common data line pair being arranged for a plurality of bit lines and representing a piece of information with a complementary logic signal;

a plurality of sense amplifiers each having first and second nodes, said bit lines being connected to either one of said first and second nodes;

a switch pair formed by first and second transistors of a second conductivity type, one of said first and second transistors being connected between one of said common data line pair and said first node, other one of said first and second transistors being connected between other one of said common data line pair and said second node, and gates of said first and second transistors being connected to a single selection line; and a decoder receiving a plurality of address signals, decoding said address signals, outputting results of said decoding to said single selection line, and causing said switch pair to electrically conductive, wherein each of said sense amplifiers includes:

third and fourth transistors of a second conductivity type, each of said third and fourth transistors having a source connected to a first common source line; and fifth and sixth transistors of a first conductivity type, each of said fifth and sixth transistors having a source connected to a second common source line, wherein a connection node of drains of said third and fifth transistors is connected to said first node and a connection node of gates of said third and fifth transistors is connected to said second node, wherein a connection node of drains of said fourth and sixth transistors is connected to said second node and a connection node of gates of said fourth and sixth transistors is connected to said first node, wherein, when said switch pair is selected and when a read operation is executed to send information about said bit lines from said sense amplifier to said common data line pair, said decoder outputs a first potential to said selection line, wherein, when said switch pair is selected and when a write operation is executed to send information about said common data line pair from said common data line pair to said sense amplifier, said decoder outputs a second potential having a value different from that of said first voltage, wherein, when said switch pair is not selected, said decoder outputs a potential causing said switch pair to be electrically disconnected to said selection line, wherein, in said write operation, said decoder receives, in addition to said plurality of address signals, a mask control signal masking writing of data in a sense amplifier connected to said bit lines selected, and wherein, when said mask control signal is activated, said decoder outputs a voltage causing said switch pair to are set non-conductive to said selection line selected by said plurality of address signals and connected to said gates of the switch pair.

(Note 2)
The semiconductor device according to note 1, further including:

a write amplifier having an input node receiving write data supplied from said outside and having an output node connected to said common data line pair, wherein, in said write operation, said mask control signal is inputted to said write amplifier, and wherein, when said mask control signal is activated, said write amplifier is set in an output high impedance state.

(Note 3)
The semiconductor device according to note 1, wherein all of said first to fourth transistors of said second conductivity type are N-type transistors, and both of said fifth and sixth transistors of said first conductivity type are P-type transistors, and wherein said first voltage is lower than said second voltage.

(Note 4)
The semiconductor device according to note 1, wherein all of said first to fourth transistors of said second conductivity type are P-type transistors, and both of said fifth and sixth transistors of said first conductivity type are N-type transistors, and wherein said first voltage is higher than said second voltage.

(Note 5)
A semiconductor device including:

a common data line pair being arranged for a plurality of bit lines and representing a piece of information with a complementary logic signal;

a plurality of sense amplifiers each having first and second nodes, said bit lines being connected to either one of said first and second nodes;

a switch pair formed by first and second transistors of a second conductivity type, one of said first and second transistors being connected between one of said common data line pair and said first node, said other transistor being connected between said other one of said common data line air and said second node and sates of said first and second transistors being connected to a single selection line; and a decoder receiving a plurality of address signals, decoding said address signals, outputting results of said decoding to said single selection line, and causing said switch pair to be turned electrically conductive, wherein each of said sense amplifiers includes:

third and fourth transistors of a second conductivity type, each of said third and fourth transistors having a source connected to a first common source line; and fifth and sixth transistors of a first conductivity type, each of said fifth and sixth transistors having a source connected to a second common source line, wherein a connection node of drains of said third and fifth transistors is connected to said first node and a connection node of gates of said third and fifth transistors is connected to said second node, wherein a connection node of drains of said fourth and sixth transistors is connected to said second node and a connection node of gates of said fourth and sixth transistors is connected to said first node, wherein, when said switch pair is selected and when a read operation is executed to send information about said bit lines from said sense amplifier to said common data line pair, said decoder outputs a first potential to said selection line, wherein, when said switch pair is selected and when a write operation is executed to send information about said common data line pair from said common data linepair to said sense amplifier, said decoder outputs a second potential having a value different from that of said first voltage, wherein when said switch pair is not selected said decoder outputs a potential causing said switch pair to be electrically disconnected to said selection line, wherein, in a write operation, said decoder receives, in addition to said plurality of address signals, a mask control signal masking writing of data in a sense amplifier connected to said bit lines selected, and wherein, when said mask control signal is activated, said decoder outputs said first voltage to said selection line selected by said plurality of address signals and connected to said gates of said switch pair.

(Note 6)
The semiconductor device according to note 5, further including:

a write amplifier having an input node data receiving write data supplied from said outside and having an output node connected to said common data line pair, wherein, in said write operation, said mask control signal is inputted to said write amplifier, and wherein, when said mask control signal is activated, said write amplifier is set in an output high impedance state.

(Note 7)
The semiconductor device according to note 5, wherein all of said first to fourth transistors of said second conductivity type are N-type transistors, and both of said fifth and sixth transistors of said first conductivity type are P-type transistors, and wherein said first voltage is lower than said second voltage.

(Note 8)
The semiconductor device according to note 5, wherein all of said first to fourth transistors of said second conductivity type are P-type transistors, and both of said fifth and sixth transistors of said first conductivity type are N-type transistors, and wherein said first voltage is higher than said second voltage.

(Note 9)
A data processing system including:

a controller and a peripheral device connected to said semiconductor device according to note 1 via a system bus.

(Note 10)
A data processing system including:

a controller and a peripheral device connected to said semiconductor device according to note 5 via a system bus.

What is claimed is:

1. A semiconductor device comprising:
a plurality of sense amplifiers, each retaining in a volatile manner data from a memory cell sensed;
a data bus;
a plurality of transistors selectively causing said plurality of sense amplifiers to be electrically connected with said data bus, in accordance with an input address, respectively;
a write amplifier connected to said data bus;
an external terminal outputting data from said memory cell to an outside of said semiconductor device via said sense amplifier, said transistor, and said data bus in a first operation mode, said external terminal providing data externally supplied from an outside of said semiconductor device to said sense amplifier via said write amplifier, said data bus, and said transistor in a second operation mode;

a mask mode in which data supplied from an outside of said semiconductor device via said external terminal is not outputted to said sense amplifier in said second operation mode; and a control circuit supplying an electric potential to a gate electrode of a first transistor of said transistors that is turned electrically conductive, in accordance with said input address, said electric potential being different depending on said first operation mode or said second operation mode, wherein, in said first operation mode, said control circuit supplies a first electric potential to said gate electrode of said first transistor, so that said first transistor has a first impedance value in a conductive state thereof, in said second operation mode, said control circuit supplies a second electric potential to said gate electrode of said first transistor, so that said first transistor has a second impedance value in a conductive state thereof, an absolute value of said second impedance value being lower than that of said first impedance value, and said control circuit further supplies said gate electrode of said first transistor, to which said mask mode is asserted, with a third electric potential less than said second electric potential, so that said first transistor has a third impedance value, an absolute value of said third impedance value being higher than that of said second impedance value.

2. The semiconductor device according to claim 1, wherein said third electric potential is equal to said first electric potential.

3. The semiconductor device according to claim 2, wherein said control circuit comprises:

a decoder receiving and decoding said input address supplied thereto; and first and second switches selectively supplying said first and second electric potentials to said decoder, said first and second electric potentials corresponding to said first and second operation modes, respectively, wherein, when said mask mode is asserted, instead of said second switch, said first switch is selected.

4. The semiconductor device according to claim 2, wherein said control circuit comprises:

a decoder receiving and decoding said address supplied thereto; and first and second switches selectively supplying said first and second electric potentials to said decoder, said first and second electric potentials corresponding to said first and second operation modes, respectively, wherein said decoder comprises:

a logic circuit receiving said input address; and a driver including an input node connected to an output node of said logic circuit and including an output node connected to said gate electrode of said first transistor, said driver being supplied with one of said first and second electric potentials from a corresponding one of said first and second switches, as a first power supply, and supplied with said third electric potential, as a second power supply to operate with said first and second power supplies, and wherein when said mask mode is asserted, said control circuit controls said driver to output said third electric potential, and said first transistor is controlled to be electrically non-conductive.

5. The semiconductor device according to claim 4, wherein a mask signal indicating said mask mode is supplied to said logic circuit, said first transistor being controlled to be electrically non-conductive by said logic circuit.

6. The semiconductor device according to claim 2, wherein said control circuit comprises:

a decoder receiving and decoding said input address supplied thereto; and first and second switches selectively supplying said first and second electric potentials to said decoder, said first and second electric potentials corresponding to said first and second operation modes, respectively.

7. The semiconductor device according to claim 6, wherein said decoder comprises:

a logic circuit receiving said input address; and a driver connected between said gate electrode of said first transistor and an output node of said logic circuit, said driver being supplied with one of said first and second electric potentials as a power supply from a corresponding one of said first and second switches.

8. The semiconductor device according to claim 2, further comprising:

a plurality of memory blocks, each including a plurality of memory cells, sequentially storing, via a plurality of said write amplifiers, a plurality of said data bus, and a plurality of said sense amplifier corresponding to said plurality of memory blocks, a plurality of items of data which are continuous in time-series and supplied from an outside of said semiconductor device via said external terminal; and a mask signal indicating said mask mode, wherein said control circuit comprises a plurality of said decoders, and a plurality of said mask signals, said plurality of decoders receiving said address in common, said decoders supplying either one of said first and second electric potentials to gate electrodes of a plurality of said first transistors corresponding to said plurality of memory blocks, based on said plurality of mask signals corresponding to respective ones of said plurality of memory blocks.

9. The semiconductor device according to claim 1, wherein said third electric potential is lower than said first electric potential and said third impedance value has an absolute value higher than that of said first impedance value.

10. The semiconductor device according to claim 1, wherein said write amplifier, to which said mask mode is asserted, is controlled to be inactive.

11. The semiconductor device according to claim 1, wherein said memory cell stores data supplied from said outside via said sense amplifier in a volatile manner.

12. The semiconductor device according to claim 1, further comprising:

a bit line connecting said memory cell and said sense amplifier, wherein said sense amplifier comprises a function of sensing information about said memory cell.

13. The semiconductor device according to claim 1, wherein said sense amplifier comprises first and second complementary transistors, each of said complementary transistors including a plurality of transistors each having a different conductivity type, an input node and an output node of said first complementary transistor being cross-coupled to an output node and an input node of said second complementary transistor, respectively.

14. A semiconductor device comprises:
   a plurality of memory cells storing a plurality of items of data;
   a plurality of sense amplifiers retaining, in a volatile manner, said plurality of items of data sensed;
   a plurality of data buses corresponding to said plurality of sense amplifiers and relating to a plurality of external terminals inputting and outputting said plurality of items of data to and from an outside of said semiconductor device;
   a plurality of transistors, each of said transistors having a gate electrode, said transistors, based on a voltage applied to said gate electrodes thereof, controlling electrical connection between said plurality of sense amplifiers and said plurality of data buses, respectively;
   a plurality of write amplifiers arranged so as to correspond to said plurality of data buses, said write amplifiers writing data supplied from said external terminals, into said memory cells, as said data, via said data buses and said sense amplifiers;
   a mask mode in which a write amplifier to be activated and a write amplifier to be inactivated are selected from said plurality of write amplifiers in a second operation mode;
   a mask signal indicating said mask mode, and
   a control circuit supplying an electric potential to a gate electrode of said transistor to make said electrical connection conductive, based on an address, wherein
   said control circuit comprises:
   a decoder including an input terminal and an output terminal connected to said gate electrodes of said transistors corresponding to said decoder and selectively activating said transistors when an address signal supplied to said input terminal indicates a predetermined address;
   first and second power supplies corresponding to a first and second electric potentials, respectively, and supplying a power supply to said decoder;
   a first switch connected between said decoder and said first power supply; and
   a second switch connected between said decoder and said second power supply, wherein
   in a first operation mode in which data retained by said sense amplifier in a volatile manner is transferred to said data bus, said control circuit applies said first electric potential to said gate electrode of said transistor selected and causes said transistor to be turned electrically conductive,
   in said second operation mode in which data retained by said sense amplifier in a volatile manner is rewritten by data supplied from said write amplifier via said data bus, said control circuit applies said second electric potential higher than said first electric potential applied to said gate electrode of said transistor selected and causes said transistor to be turned electrically conductive, and
   said first and second switches controlled to be turned electrically conductive in said first and second operation modes, respectively, and
   said control circuit uses said mask signal to cause a part of said decoder to be inactive and to cause said transistors corresponding to said a part of decoder to non-conductive.

15. The semiconductor device according to claim 14, wherein in addition to said address signal, said mask signal is received by said decoder, and wherein
   when said mask signal is activated, irrespective of a logic of said address signal, said decoder outputs a signal causing said transistors corresponding to said decoder to are set non-conductive from said output terminal.

16. The semiconductor device according to claim 14, wherein said control circuit comprises
   a second control circuit generating a signal controlling said first and second switches, wherein
   said second control circuit receives said mask signal and a signal indicating whether a mode is said first or second operation mode, and wherein
   when said mask signal is activated, irrespective of a logic of said signal indicating whether said mode is said first or second operation mode, said second control circuit outputs a signal causing said first switch to electrically conductive and said second switch to non-conductive.

17. The semiconductor device according to claim 16, comprising:
   a plurality of memory blocks, each of said memory blocks including said plurality of memory cells, and sequentially storing a plurality of items of write data which are continuous in time-series and supplied from said outside, via said write amplifiers, said data buses, and said sense amplifiers corresponding to said plurality of memory blocks,
   said plurality of decoders separately controlled to be active and inactive being arranged in said plurality of memory blocks, respectively.

18. The semiconductor device according to claim 14, wherein
   a plurality of said decoders are provided, said plurality of decoders corresponding to said plurality of write amplifiers, said decoders receiving said address in common, wherein each of said plurality of decoders is separately controlled to be active and inactive by a corresponding ones of a plurality of said mask signals.

19. The semiconductor device according to claim 14, wherein said decoder comprises:
   a logic circuit outputting a first logic level when said address signal indicates a predetermined address;
   a first transistor connected between a power supply having an electric potential lower than said first and second electric potentials and said output terminal, said first transistor having a gate electrode connected to an output node of said logic circuit, said first transistor establishing electrical continuity when said logic circuit outputs said first logic level; and
   a second transistor connected between said output terminal and a first node, said second transistor having a gate electrode connected to said output node of said logic circuit, said second transistor establishing continuity when said logic circuit outputs a second logic level, wherein said first switch is connected between said first node and said first power supply and establishes electrical continuity in said first operation mode, and
   said second switch is connected between said first node and said second power supply and establishes electrical continuity in said second operation mode.

20. The semiconductor device according to claim 14, wherein said memory cell stores data supplied from said external terminal in a volatile manner.

21. The semiconductor device according to claim 14, further comprising
   a bit line connecting said memory cell and said sense amplifier, wherein said sense amplifier comprise
   a function of sensing information of said memory cell.

22. The semiconductor device according to claim 14, wherein each of said sense amplifiers comprises
first and second complementary transistors, each of said complementary transistors including a plurality of transistors each having a different conductivity type, an input node and an output node of said first complementary transistor being cross-coupled to an output node and an input node of said second complementary transistor, respectively.

23. A data processing system comprising:
a controller;
a peripheral device;
a system bus; and
a semiconductor device, said controller and said peripheral device being connected to said semiconductor device via said system bus, wherein said semiconductor device comprises:
a plurality of sense amplifiers, each retaining in a volatile manner data from a memory cell sensed;
a data bus;
a plurality of transistors selectively causing said plurality of sense amplifiers to be electrically connected with said data bus, in accordance with an input address, respectively;
a write amplifier connected to said data bus;
an external terminal outputting data from said memory cell to an outside of said semiconductor device via said sense amplifier, said transistor, and said data bus in a first operation mode, said external terminal providing data externally supplied from an outside of said semiconductor device to said sense amplifier via said write amplifier, said data bus, and said transistor in a second operation mode;
a mask mode in which data supplied from an outside of said semiconductor device via said external terminal is not outputted to said sense amplifier in said second operation mode; and
a control circuit supplying an electric potential to a gate electrode of a first transistor of said transistors that is turned electrically conductive, in accordance with said input address, said electric potential being different depending on said first operation mode or said second operation mode, wherein,
in said first operation mode, said control circuit supplies a first electric potential to said gate electrode of said first transistor, so that said first transistor has a first impedance value in a conductive state thereof,
in said second operation mode, said control circuit supplies a second electric potential to said gate electrode of said first transistor, so that said first transistors has a second impedance value in a conductive state thereof, an absolute value of said second impedance value being lower than that of said first impedance value, and
said control circuit supplies said gate electrodes of said first transistor, to which said mask mode is asserted, with a third electric potential less than said second electric potential, so that said first transistor has a third impedance value, an absolute value of said third impedance value being higher than that of said second impedance value.

24. A data processing system comprising:
a controller;
a peripheral device;
a system bus; and
a semiconductor device, said controller and said peripheral device being connected to said semiconductor device via said system bus, wherein said semiconductor device comprises:
a plurality of memory cells storing a plurality of items of data;
a plurality of sense amplifiers retaining, in a volatile manner, said plurality of items of data sensed;
a plurality of data buses corresponding to said plurality of sense amplifiers and relating to a plurality of external terminals inputting and outputting said plurality of items of data to and from an outside of said semiconductor device;
a plurality of transistors, each of said transistors having a gate electrode, said transistors, based on a voltage applied to said gate electrodes thereof, controlling electrical connection between said plurality of sense amplifiers and said plurality of data buses, respectively;
a plurality of write amplifiers arranged so as to correspond to said plurality of data buses, said write amplifiers writing data supplied from said external terminals, into said memory cells, as said data, via said data buses and said sense amplifiers;
a mask mode in which a write amplifier to be activated and a write amplifier to be inactivated are selected from said plurality of write amplifiers in said second operation mode;
a mask signal indicating said mask mode, and
a control circuit supplying an electric potential to a gate electrode of said transistor to make said electrical connection conductive, based on an address, wherein
said control circuit comprises:
a decoder including an output terminal connected to said gate electrodes of said transistors corresponding to said decoder and selectively activating said transistors when an address signal supplied to an input terminal of said decoder indicates a predetermined address;
first and second power supplies corresponding to said first and second electric potentials, respectively, and supplying a power supply to said decoder;
a first switch connected between said decoder and said first power supply; and
a second switch connected between said decoder and said second power supply, wherein
in a first operation mode in which data retained by said sense amplifier in a volatile manner is transferred to said data bus, said control circuit applies said first electric potential to said gate electrode of said transistor selected and causes said transistor to be turned electrically conductive,
in a second operation mode in which data retained by said sense amplifier in a volatile manner is rewritten by data supplied from said write amplifier via said data bus, said control circuit applies said second electric potential higher than said first electric potential applied to said gate electrode of said transistor selected and causes said transistor to be turned electrically conductive, and
said first and second switches controlled to be turned electrically conductive in said first and second operation modes, respectively, and
said control circuit uses said mask signal to cause said decoder corresponding to said inactivated write amplifier to be inactive and to cause said transistors corresponding to said decoder to are set non-conductive.

* * * * *